(12) United States Patent
Kang et al.

(10) Patent No.: US 11,742,145 B2
(45) Date of Patent: Aug. 29, 2023

(54) MULTILAYER ELECTRONIC COMPONENT AND BOARD FOR MOUNTING THE SAME

(71) Applicant: SAMSUNG ELECTRO-MECHANICS CO., LTD., Suwon-si (KR)

(72) Inventors: Jeong Mo Kang, Suwon-si (KR); Jin Mo Ahn, Suwon-si (KR); Ga Young An, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 17/468,242

(22) Filed: Sep. 7, 2021

(65) Prior Publication Data

US 2022/0165501 A1    May 26, 2022

(30) Foreign Application Priority Data

Nov. 25, 2020  (KR) .......................... 10-2020-0160267

(51) Int. Cl.
*H01G 4/30* (2006.01)
*H01G 4/008* (2006.01)
*H01G 2/06* (2006.01)
*H01G 4/12* (2006.01)
*H01G 4/012* (2006.01)

(52) U.S. Cl.
CPC .............. *H01G 4/30* (2013.01); *H01G 2/065* (2013.01); *H01G 4/008* (2013.01); *H01G 4/012* (2013.01); *H01G 4/12* (2013.01)

(58) Field of Classification Search
CPC .......... H01G 4/008; H01G 4/012; H01G 4/12; H01G 4/2325; H01G 4/30; H01G 2/065; H05K 1/181
See application file for complete search history.

(56) References Cited

U.S. PATENT DOCUMENTS

| 2016/0212850 | A1 | 7/2016 | Kainuma et al. | |
| 2017/0271081 | A1* | 9/2017 | Maki ..................... | H01G 4/248 |
| 2021/0125783 | A1* | 4/2021 | Onodera ................ | H01G 4/232 |
| 2021/0343478 | A1* | 11/2021 | Kojima .................. | H01G 4/232 |

FOREIGN PATENT DOCUMENTS

| JP | 2016-136614 A | 7/2016 |
| KR | 10-2017-0084156 A | 7/2017 |

\* cited by examiner

*Primary Examiner* — Nathan Milakovich
(74) *Attorney, Agent, or Firm* — MORGAN, LEWIS & BOCKIUS LLP (57) ABSTRACT

A multilayer electronic component includes: a body including a dielectric layer and internal electrodes and including first and second surfaces opposing each other in a first direction, third and fourth surfaces connected to the first and second surfaces and opposing each other in a second direction, and fifth and sixth surfaces connected to the first to fourth surfaces and opposing each other in a third direction; and an external electrode including a connection portion disposed on one of the third and fourth surfaces, an upper band portion extending from the connection portion onto a portion of the second surface, and a lower band portion extending onto a portion of the first surface. The external electrode includes a Pd plating layer disposed on an external surface of the lower band portion, and the Pd plating layer is disposed to extend onto a portion of the connection portion.

26 Claims, 8 Drawing Sheets

MULTILAYER ELECTRONIC COMPONENT AND BOARD FOR MOUNTING THE SAME

CROSS-REFERENCE TO RELATED APPLICATION(S)

This application claims benefit of priority to Korean Patent Application No. 10-2020-0160267 filed on Nov. 25, 2020 in the Korean Intellectual Property Office, the disclosure of which is incorporated herein by reference in its entirety.

TECHNICAL FIELD

The present disclosure relates to a multilayer electronic component and a board for mounting the same.

BACKGROUND

A multilayer ceramic capacitor (MLCC), a multilayer electronic component, is a chip-type condenser mounted on the printed circuit boards of various types of electronic products such as display devices including liquid crystal displays (LCDs) and plasma display panels (PDPs), computers, smartphones, cell phones, and the like, to allow electricity to be charged therein and discharged therefrom.

As industry interest in electric parts for automobiles has recently increased, MLCCs are also required to have high reliability and high strength characteristics in order to be used in automobile or infotainment systems.

In particular, multilayer ceramic capacitors disposed near an engine bay are exposed to a high temperature environment. In this case, external electrodes of the MLCC, a solder bonding a substrate and the external electrodes of the MLCC, and the like may expand and contract according to temperature changes to cause mechanical stress to crack the solder.

In order to prevent this, a method of mounting a multilayer capacitor on a substrate using a conductive resin adhesive instead of a solder has been proposed. Accordingly, a structure of a plating layer of the MLCC needs to be changed.

SUMMARY

Exemplary embodiments provide a multilayer electronic component having excellent reliability.

Exemplary embodiments provide a multilayer electronic component reduced in terms of manufacturing costs.

Exemplary embodiments provide a multilayer electronic component suitable for mounting on a substrate using a conductive resin adhesive.

According to an aspect of the present disclosure, a multilayer electronic component includes: a body including a dielectric layer and internal electrodes and including first and second surfaces opposing each other in a first direction, third and fourth surfaces connected to the first and second surfaces and opposing each other in a second direction, and fifth and sixth surfaces connected to the first to fourth surfaces and opposing each other in a third direction; and an external electrode including a connection portion disposed on one of the third and fourth surfaces, an upper band portion extending from the connection portion onto a portion of the second surface, and a lower band portion extending onto a portion of the first surface. The external electrode includes a Pd plating layer disposed on an external surface of the lower band portion, and the Pd plating layer is disposed to extend onto a portion of the connection portion.

According to an aspect of the present disclosure, a board for mounting a multilayer electronic component includes: a substrate with an electrode pad disposed thereon; a multilayer electronic component including a body having a dielectric layer and internal electrodes and including first and second surfaces opposing each other in a first direction, third and fourth surfaces connected to the first and second surfaces and opposing each other in a second direction, and fifth and sixth surfaces connected to the first to fourth surfaces and opposing each other in a third direction, and an external electrode including a connection portion disposed on one of the third and fourth surfaces, an upper band portion extending from the connection portion onto a portion of the second surface, and a lower band portion extending onto a portion of the first surface. The external electrode includes a Pd plating layer disposed on an external surface of the lower band portion, and the Pd plating layer is disposed to extend onto a portion of the connection portion; and a conductive resin adhesive bonding the external electrode to the electrode pad.

According to an aspect of the present disclosure, a board for mounting a multilayer electronic component includes: a body including a dielectric layer and first and second internal electrodes with the dielectric layer disposed therebetween; and an external electrode including a connection portion disposed on one surface of the body, from which one of the first and second internal electrodes is exposed, to connect to the one of the first and second internal electrodes, and band portions extending from the connection portion respectively onto surfaces of the body connected to the one surface. The external electrode includes a Pd plating layer disposed on one of the band portions.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or exemplary embodiment, e.g., as to what an example or exemplary embodiment may include or implement, means that at least an example or exemplary embodiment exists in which such a feature is included or implemented while all examples and exemplary embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

In the drawings, a first direction may be defined as a thickness direction or a stacking direction of a body, a second direction may be defined as a length direction of the body, and a third direction may be defined as a width direction of the body.

Multilayer Electronic Component

Figure 1:
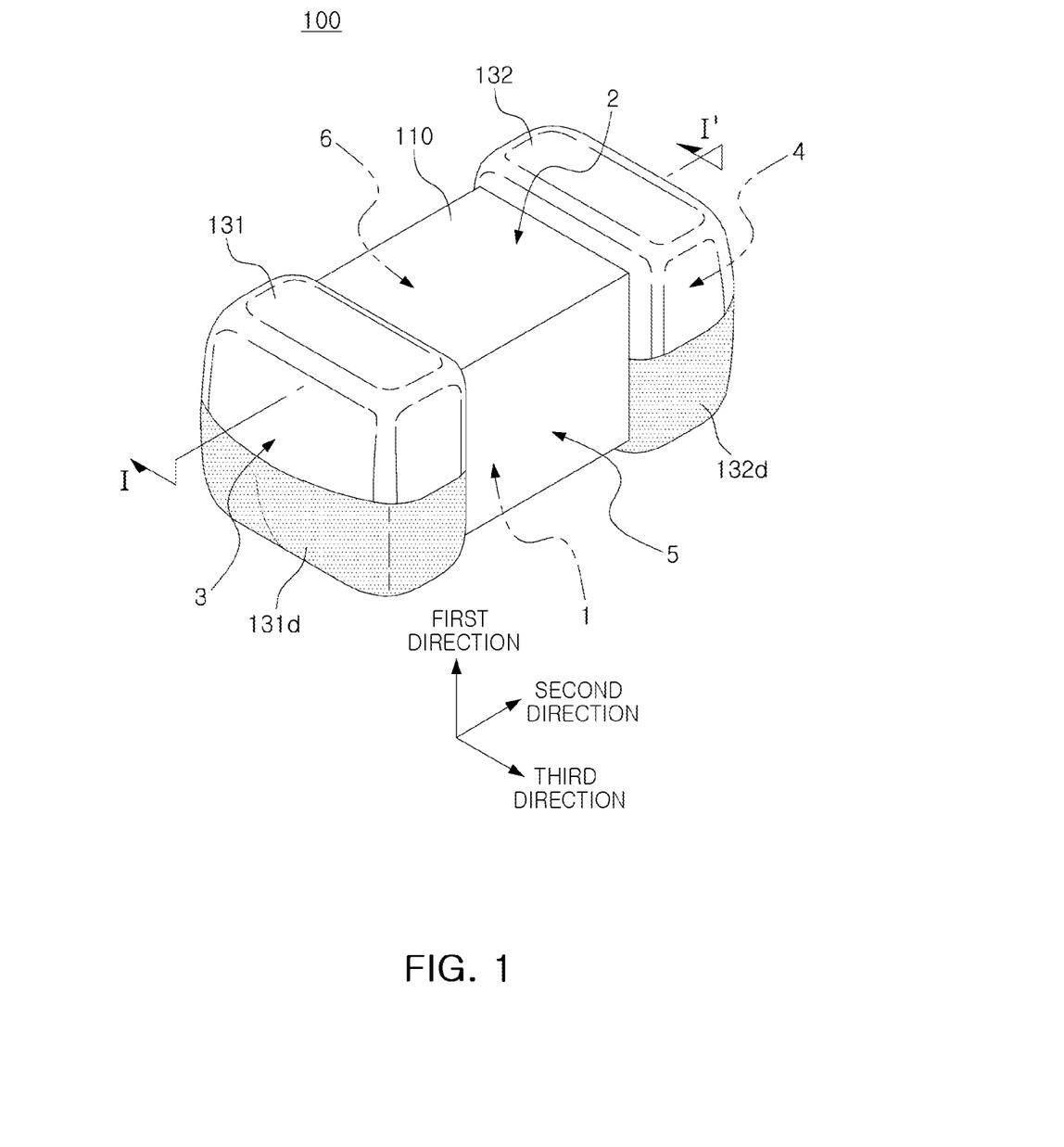
FIG. 1 is a schematic perspective view of a multilayer electronic component according to an exemplary embodiment in the present disclosure.

FIG. 1 is a schematic perspective view of a multilayer electronic component according to an exemplary embodiment in the present disclosure.

Figure 2:
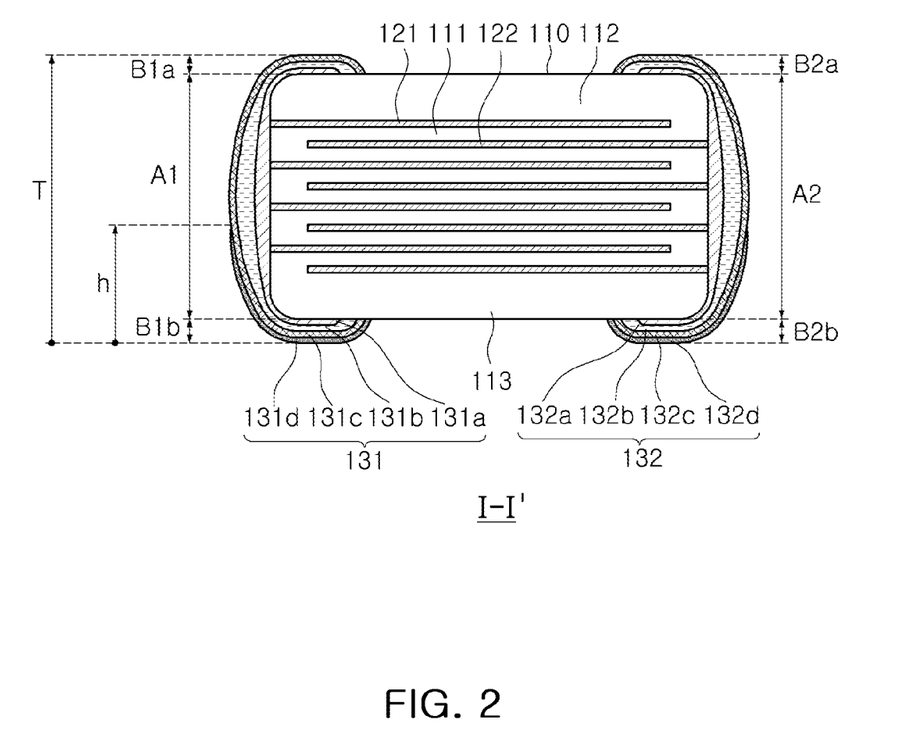
FIG. 2 is a cross-sectional view taken along line I-I' of FIG. 1.

FIG. 2 is a cross-sectional view taken along line I-I' of FIG. 1.

Figure 3:
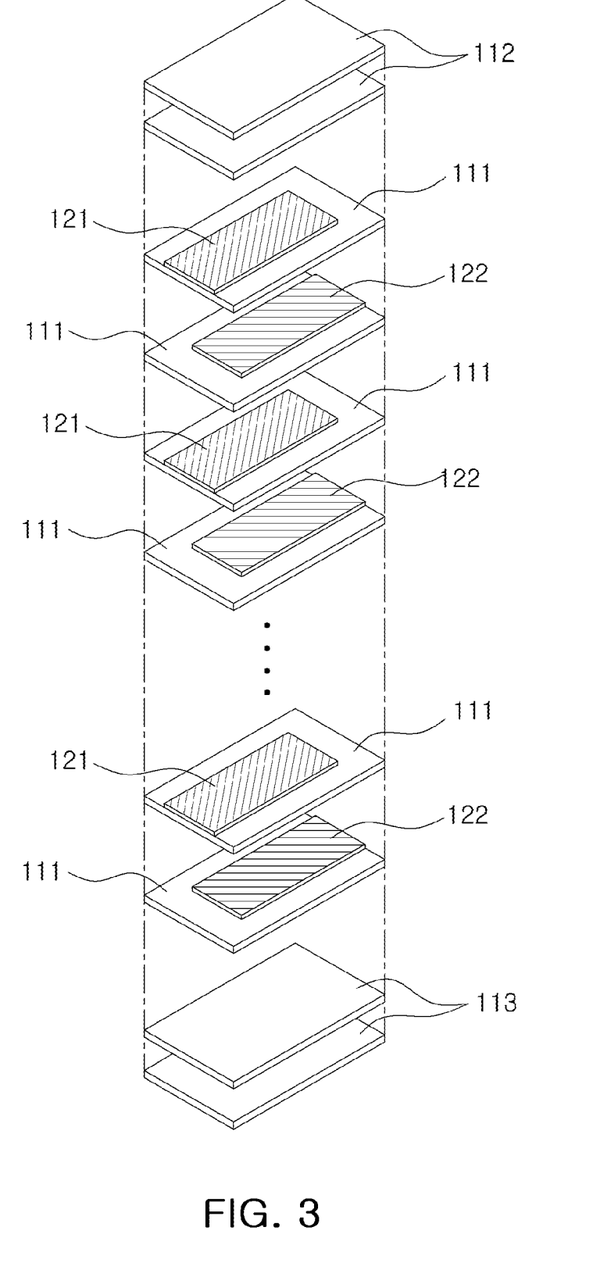
FIG. 3 is an exploded perspective view schematically illustrating a body according to an exemplary embodiment in the present disclosure.

FIG. 3 is an exploded perspective view schematically illustrating a body according to an exemplary embodiment in the present disclosure.

Figure 4:
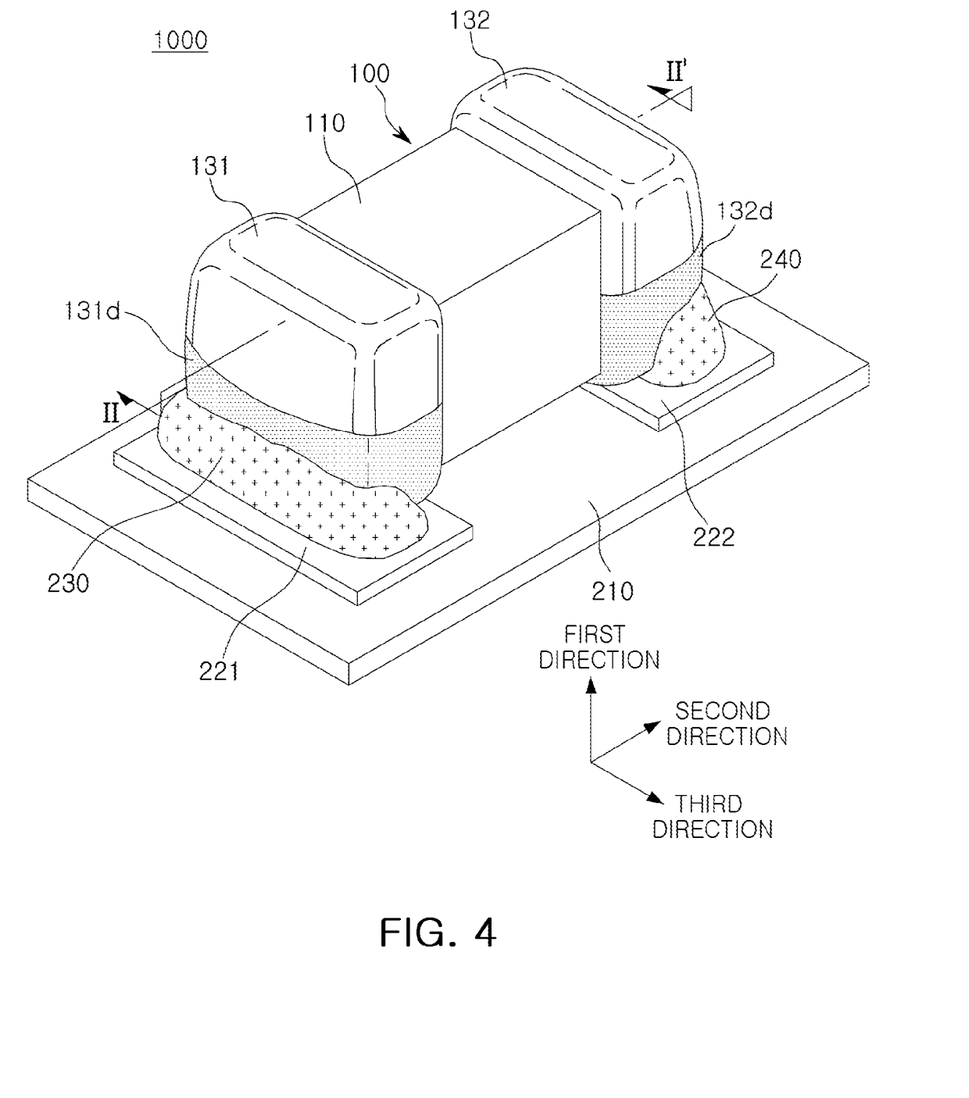
FIG. 4 is a schematic perspective view of a mounting board on which a multilayer electronic component is mounted according to an exemplary embodiment in the present disclosure.

FIG. 4 is a schematic perspective view of a mounting board on which a multilayer electronic component is mounted according to an exemplary embodiment in the present disclosure.

Figure 5:
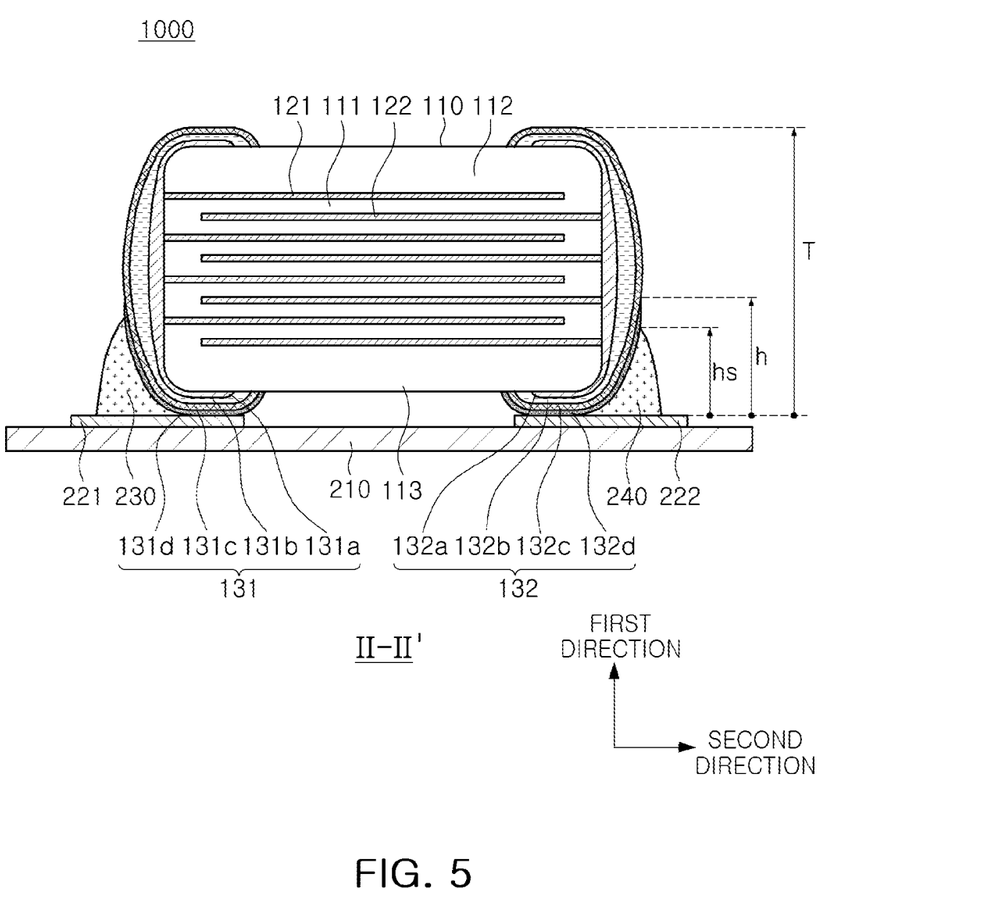
FIG. 5 is a cross-sectional view taken along line II-II' of FIG. 4.

FIG. 5 is a cross-sectional view taken along II-II' of FIG. 4.

Hereinafter, a multilayer electronic component 100 according to an exemplary embodiment in the present disclosure will be described with reference to FIGS. 1 to 5.

A multilayer electronic component 100 according to an exemplary embodiment in the present disclosure includes a body 110 including a dielectric layer 111 and internal electrodes 121 and 122 and including first and second surfaces 1 and 2 opposing each other in a first direction, third and fourth surfaces 3 and 4 connected to the first and second surfaces 1 and 2 and opposing each other in a second direction, and fifth and sixth surfaces 5 and 6 connected to the first to fourth surfaces 1 to 4 and opposing each other in a third direction; and external electrodes including connection portions A1 and A2 disposed on the third and fourth surfaces, upper band portions B1a and B2a extending from the connection portions onto portions of the second surface, and lower band portions B1b and B2b extending onto portions of the first surface. The external electrodes include Pd plating layers 131d and 132d disposed on external surfaces of the lower band portions B1b and B2b, and the Pd plating layers 131d and 132d are disposed to extend onto portions of the connection portions A1 and A2.

In the body 110, the dielectric layer 111 and the internal electrodes 121 and 122 are alternately stacked.

A specific shape of the body 110 is not limited, but, as illustrated, the body 110 may have a hexahedral shape or a similar shape. Due to shrinkage of ceramic powder particles contained in the body 110 during sintering, the body 110 may not have a hexahedral shape with perfectly straight lines but may have a substantially hexahedral shape.

The body 110 may have the first and second surfaces 1 and 2 opposing each other in the first direction, the third and fourth surfaces 3 and 4 connected to the first and second surfaces 1 and 2 and opposing each other in the second direction, and the fifth and sixth surfaces 5 an 6 connected to the first and second surfaces 1 and 2, connected to the third and fourth surfaces 3 and 4, and opposing each other in the third direction.

A plurality of dielectric layers 111 forming the body 110 are in a sintered state, and adjacent dielectric layers 111 may be integrated such that boundaries therebetween may not be readily apparent without using a scanning electron microscope (SEM).

According to an exemplary embodiment in the present disclosure, a material for forming the dielectric layer 111 is not limited as long as sufficient capacitance may be obtained. For example, a barium titanate-based material, a lead composite perovskite-based material, or a strontium titanate-based material may be used. The barium titanate-based material may include a $BaTiO_3$-based ceramic powder particle, and the ceramic powder particle may include $BaTiO_3$ and $(Ba_{1-x}Ca_x)TiO_3$, $Ba(Ti_{1-y}Ca_y)O_3$, $(Ba_{1-x}Ca_x)(Ti_{1-y}Zr_y)O_3$, or $Ba(Ti_{1-y}Zr_y)O_3$ obtained by partially dissolving calcium (Ca), zirconium (Zr), and the like in $BaTiO_3$.

As a material for forming the dielectric layer 111, various ceramic additives, organic solvents, binders, dispersants, etc. may be added to the powder particle such as barium titanate ($BaTiO_3$) or the like according to purposes of the present disclosure.

The body 110 may include a capacitance forming portion formed inside the body 110 and forming capacitance with the first internal electrode 121 and the second internal electrode 122 disposed to face each other with the dielectric layer 111 interposed therebetween and protective layers 112 and 113 formed above and below the capacitance forming portion.

The capacitance forming portion is a part that contributes to formation of capacitance of the capacitor, which may be formed by repeatedly stacking a plurality of first and second internal electrodes 121 and 122 with the dielectric layer 111 interposed therebetween.

The upper protective layer 112 and the lower protective layer 113 may be formed by stacking a single dielectric layer or two or more dielectric layers on upper and lower surfaces of the capacitance forming portion in an up-down direction, respectively, and may basically serve to prevent damage to the internal electrodes due to physical or chemical stress.

The upper protective layer 112 and the lower protective layer 113 may not include an internal electrode and may include the same material as that of the dielectric layer 111.

The internal electrodes 121 and 122 may be disposed to face each other with the dielectric layer 111 interposed therebetween.

The internal electrodes 121 and 122 may include first and second internal electrodes 121 and 122 alternately disposed to face each other with the dielectric layer 111 interposed therebetween.

The first and second internal electrodes 121 and 122 may be exposed to the third and fourth surfaces 3 and 4 of the body 110, respectively.

Referring to FIG. 2, the first internal electrode 121 may be spaced apart from the fourth surface 4 and exposed to the third surface 3, and the second internal electrode 122 may be spaced apart from the third surface 3 and exposed to the fourth surface 4. The first external electrode 131 may be disposed on the third surface 3 of the body 110 and connected to the first internal electrode 121 and the second external electrode 132 may be disposed on the fourth surface 4 of the body 110 and connected to the second internal electrode 122.

In other words, the first internal electrode 121 may not be connected to the second external electrode 132 and may be connected to the first external electrode 131, and the second internal electrode 122 may not be connected to the first external electrode 131 and may be connected to the second external electrode 132. Accordingly, the first internal electrode 121 is formed to be spaced apart from the fourth surface 4 by a predetermined distance, and the second internal electrode 122 is formed to be spaced apart from the third surface 3 by a predetermined distance.

The first and second internal electrodes 121 and 122 may be electrically separated from each other by the dielectric layer 111 disposed therebetween.

Referring to FIG. 3, the body 110 may be formed by stacking the dielectric layer 111 on which the first internal electrode 121 is printed and the dielectric layer 111 on which the second internal electrode 122 is printed in the thickness direction (first direction) and subsequently sintering the stack.

A material forming the internal electrodes 121 and 122 is not limited, and a material having excellent electrical conductivity may be used. For example, the internal electrodes 121 and 122 may be formed by printing a conductive paste for internal electrodes including at least one of nickel (Ni), copper (Cu), palladium (Pd), silver (Ag), gold (Au), platinum (Pt), tin (Sn), tungsten (W), titanium (Ti), and alloys thereof on a ceramic green sheet.

As a printing method of the conductive paste for internal electrodes, a screen-printing method or a gravure printing method may be used, but the present disclosure is not limited thereto.

The external electrodes 131 and 132 may include the connection portions A1 and A2 disposed on the third and fourth surfaces 3 and 4 of the body 110, the upper band portions B1a and B2a extending from the connection portions A1 and A2 onto portions of the second surface 2, and the lower band portions B1b and B2b extending onto portions of the first surface 1, respectively.

The external electrodes 131 and 132 may include a first external electrode 131 disposed on the third surface and a second external electrode 132 disposed on the fourth surface 4.

Referring to FIG. 2, when regions of the first external electrode 131 are divided according to positions, the first external electrode 131 may include a first connection portion A1 disposed on the third surface 3 of the body 110, a first upper band portion B1a extending from the first connection portion A1 to a portion of the second surface 2, and a first lower band portion B1b extending from the first connection portion A1 to a portion of the first surface 1.

When regions of the second external electrode 132 are divided according to positions, the second external electrode 132 may include a second connection portion A2 disposed on the fourth surface 4 of the body 110, a second upper band portion B2a extending from the second connection portion A2 to a portion of the second surface 2, and a second lower band portion B2b extending from the second connection portion A2 to a portion of the first surface 1.

The external electrodes 131 and 132 may include Pd plating layers 131d and 132d disposed on the external surfaces of the lower band portions B1b and B2b, respectively, and the Pd plating layers 131d and 132d may be disposed to extend onto portions of the connection portions A1 and A2, respectively. Here, since the Pd plating layers 131d and 132d are disposed to extend only to portions of the connection portions A1 and A2, the Pd plating layers may not be disposed on external surfaces of the upper band portions B1a and B2a of the external electrodes 131 and 132.

In general, in order to mount a multilayer electronic component on a substrate, the external electrodes of the multilayer electronic component are bonded to electrode pads of the substrate using a solder. However, in the case of using a solder, mechanical stress may occur due to expansion and contraction caused by temperature changes in external electrodes of the multilayer electronic component, the solder that bonds the substrate to the external electrodes, and the like, causing cracks in the solder itself.

To prevent this, a method of mounting a multilayer capacitor on a substrate using a conductive resin adhesive instead of a solder has been proposed. A thermal curing temperature of the conductive resin adhesive is lower than a melting point of the solder. Therefore, the use of a conductive resin adhesive, instead of a solder may reduce thermal stress, thereby improving reliability.

In the case of mounting a multilayer capacitor on a substrate using a conductive resin adhesive, the outermost plating layer may be formed of a Pd plating layer to prevent corrosion or precipitation of external electrodes and improve reliability. However, Pd is expensive so the use of Pb increases manufacturing cost of the multilayer electronic component.

According to the present disclosure, by disposing the Pd plating layers 131d and 132d only partially, it is possible to reduce manufacturing cost, while preventing corrosion or precipitation of the external electrodes and improving reliability. In other words, by disposing the Pd plating layers 131d and 132d only in the regions in contact with the conductive resin adhesives 230 and 240, corrosion or precipitation of the external electrodes may be prevented and reliability may be improved similar to a case in which the Pd plating layer is disposed on the entire external surface of the external electrodes, while reducing manufacturing cost.

Since the Pd plating layers 131d and 132d have excellent corrosion resistance, thereby increasing affinity between the external electrodes 131 and 132 and the conductive resin adhesives 230 and 240 and increasing electrical connectivity with the conductive resin adhesive 230 and 240.

Meanwhile, the Pd plating layers 131d and 132d of the present disclosure may refer to layers consisted of a metal containing Pd. However, the Pd plating layers 131d and 132d may not refer to layers including only Pd but may include a Pd—Ni alloy or another Pd alloy or may include any other metal element than Pd.

A method for forming the Pd plating layers 131d and 132d in a form extending from the external surfaces of the lower band portions B1b and B2b to the connection portions A1 and A2 is not limited.

For example, a Pd plating layer may be formed only in a portion of the external electrode by immersing only a portion of a multilayer electronic component in a Pd plating bath to perform Pd plating.

As another example, the Pd plating layer may be formed by forming an insulating layer in a region of the external electrode excluding a region in which the Pd plating layer is to be formed and subsequently performing Pd plating. Here, a method of forming the insulating layer is not particularly limited, and for example, the insulating layer may be formed by applying an insulating material. In addition, the insulating layer may be removed later or may remain.

Referring to FIG. 2, when a first directional distance (length) of the external electrode from the lowermost point to the uppermost point in the first direction is T and a first directional distance (length) from the lowermost point of the external electrode in the first direction to the uppermost point of the Pd plating layer in the first direction is h, $0.44T < h$ may be satisfied.

Here, T may refer to a thickness of the multilayer electronic component, and h may refer to a maximum height of the Pd plating layer.

If h is 0.44T or less, the height h of the Pd plating layer may be lower than a height hs of the conductive resin adhesives 230 and 240 to be secured at the least in the case of mounting, resulting in failure of sufficiently securing mechanical coupling force or electrical connectivity with electrode pads 221 and 222.

An upper limit of h may not be particularly limited. However, as the Pd plating layers 131d and 132d are disposed extend onto portions of the connection portions A1 and A2, the Pd plating layers may not be disposed on the external surfaces of the upper band portions B1a and B2a in the external electrodes 131 and 132.

Meanwhile, depending on the thickness T of the multilayer electronic component, required mechanical coupling force and/or electrical connectivity between the multilayer electronic component 100 and the substrate 210 may vary, and accordingly, a required height hs of the conductive adhesive may vary. Therefore, the height h of the Pd plating layer may be appropriately adjusted according to the thickness T of the multilayer electronic component.

In an exemplary embodiment, when T is 2375 μm or more and 2625 μm or less, the height of the conductive adhesive for ensuring mechanical coupling force and electrical connectivity required between the multilayer electronic component and the substrate is about 1100 μm. Thus, h may be greater than 1100 μm. Here, the multilayer electronic component may have a 3225 size (3.2 mm in length and 2.5 mm in width).

In an exemplary embodiment, when T is 1520 μm or more and 1680 μm or less, the height of the conductive adhesive for ensuring mechanical coupling force and electrical connectivity required between the multilayer electronic component and the substrate is about 790 μm. Thus, h may be greater than 790 μm. Here, the multilayer electronic component may have a 3216 size (3.2 mm in length and 1.6 mm in width).

In an exemplary embodiment, when T is 1187.5 μm or more and 1312.5 μm or less, the height of the conductive adhesive for ensuring mechanical coupling force and electrical connectivity required between the multilayer electronic component and the substrate is about 760 μm. Thus, h may be greater than 760 μm. Here, the multilayer electronic component may have a 2012 size (2.0 mm in length and 1.2 mm in width).

In an exemplary embodiment, when T is 760 μm or more and 840 μm or less, the height of the conductive adhesive for ensuring mechanical coupling force and electrical connectivity required between the multilayer electronic component and the substrate is about 730 μm. Thus, h may be greater than 730 μm. Here, the multilayer electronic component may have a 1608 size (1.6 mm in length and 0.8 mm in width).

In an exemplary embodiment, when T is 475 μm or more and 525 μm or less, the height of the conductive adhesive for ensuring mechanical coupling force and electrical connectivity required between the multilayer electronic component and the substrate is about 455 μm. Thus, h may be greater than 455 μm. Here, the multilayer electronic component may have a 1005 size (1.0 mm in length and 0.5 mm in width).

Here, the lowest and highest points of the external electrodes 131 and 132 in the first direction, the highest point of the Pd plating layer in the first direction, and T and h may be measured from a cross-section of the body taken in the first and second directions at the center of the body in the third direction. That is, these values may be measured by exposing the cross-section as shown in FIG. 2. In addition, the center of the body in the third direction may refer to a ½ point of the body in the third direction. An observation tool for measurement is not particularly limited, and for example, an optical microscope, a scanning electron microscope (SEM), or the like may be used.

In general, a size of the external electrodes 131 and 132 in the first direction may be a maximum when measured at the center of the body 110 in the third direction and may gradually decrease in a direction away from the center in the third direction. Therefore, it may be desirable to measure the value based on the cross-section taken in the first and second directions at the center of the body 110 in the third direction. Meanwhile, there may be a measurement error depending on a cutting process, polishing process, etc. for exposing the cross-section in the first and second directions, and it is necessary to note that values within such an error range are within an equal range of the numerical range presented in the present disclosure.

Here, the external electrodes 131 and 132 may include electrode layers 131a and 132a disposed on the body, conductive resin layers 131b and 132b disposed on the electrode layers, and Ni plating layers 131c and 132c disposed on the conductive resin layers, respectively, and the Pd plating layers 131d and 132d may be disposed on external surfaces of the Ni plating layers 131c and 132c, respectively.

The electrode layers 131 and 132 may be formed of any material as long as the material has electrical conductivity such as metal, and a specific material may be determined in consideration of electrical characteristics and structural stability.

For example, the electrode layers 131 and 132 may include a conductive metal and glass.

A conductive metal used in the electrode layers 131a and 132a is not limited as long as it is a material that can be electrically connected to the internal electrode for forming capacitance. For example, the conductive metal may include at least one selected from the group consisting of nickel (Ni), copper (Cu), palladium (Pd), silver (Ag), gold (Au), platinum (Pt), tin (Sn), tungsten (W), titanium (Ti), and alloys thereof.

The electrode layers 131a and 132a may be formed by applying a conductive paste prepared by adding a glass frit to the conductive metal powder particle and subsequently sintering the conductive paste.

In addition, the electrode layers 131a and 132a may also be formed using an atomic layer deposition (ALD), a molecular layer deposition (MLD) method, a chemical vapor deposition (CVD) method, a sputtering method, or the like.

In addition, the electrode layers 131a and 132a may be formed by transferring a sheet including a conductive metal onto the body 110.

The conductive resin layers 131b and 132b may include a conductive metal and a base resin.

The conductive metal included in the conductive resin layers 131b and 132b serves to electrically connect the conductive resin layers 131b and 132b to the electrode layers 131a and 132a.

The conductive metal included in the conductive resin layers 131b and 132b is not particularly limited as long as it is a material that can be electrically connected to the electrode layers 131a and 132a, and may include at least one selected from the group consisting of, for example, nickel (Ni), copper (Cu), palladium (Pd), silver (Ag), gold (Au), platinum (Pt), tin (Sn), tungsten (W), titanium (Ti), and alloys thereof.

The conductive metal included in the conductive resin layers 131b and 132b may include at least one of a spherical powder particle and a flake powder particle. That is, the conductive metal may be consisted of only the flake powder particle or only the spherical powder particle or may be consisted of a mixture of the flake powder particle and the spherical powder particle.

Here, the spherical powder particle may include a form that is not completely spherical, for example, a form in which a length ratio of a major axis and a minor axis (major axis/minor axis) is 1.45 or less.

The flake powder particle refers to a powder particle having a flat and elongated shape, in which a length ratio of a major axis and a minor axis (major axis/minor axis) may be 1.95 or more, but is not limited thereto.

The lengths of the major axis and the minor axis of the spherical powder particle and the flake powder particle may be measured from an image obtained by scanning the first- and second-directional cross-section (L-T cross-section) taken at a central portion of a multilayer electronic component in the third direction with an SEM.

The base resin included in the conductive resin layers 131b and 132b serves to ensure bondability and absorb shock.

The base resin included in the conductive resin layers 131b and 132b is not particularly limited and may be any resin as long as the resin has bondability and shock absorbing properties and is mixed with conductive metal powder particles to produce a paste. For example, the resin may include at least one of an epoxy resin and an acrylic resin.

In addition, the conductive resin layers 131b and 132b may include a conductive metal, an intermetallic compound, and a base resin.

The Ni plating layers 131c and 132c may serve to prevent corrosion of the electrode layers 131a and 132a and the conductive resin layers 131b and 132b.

The Ni plating layers 131c and 132c may be easily oxidized and may be difficult to sufficiently secure electrical connectivity with the conductive resin adhesive. Here, according to the present disclosure, since the Pd plating layers 131d and 132d are disposed on the external surfaces of the Ni plating layers 131c and 132c, electrical connectivity with the conductive resin adhesive may be sufficiently secured.

Figure 6:
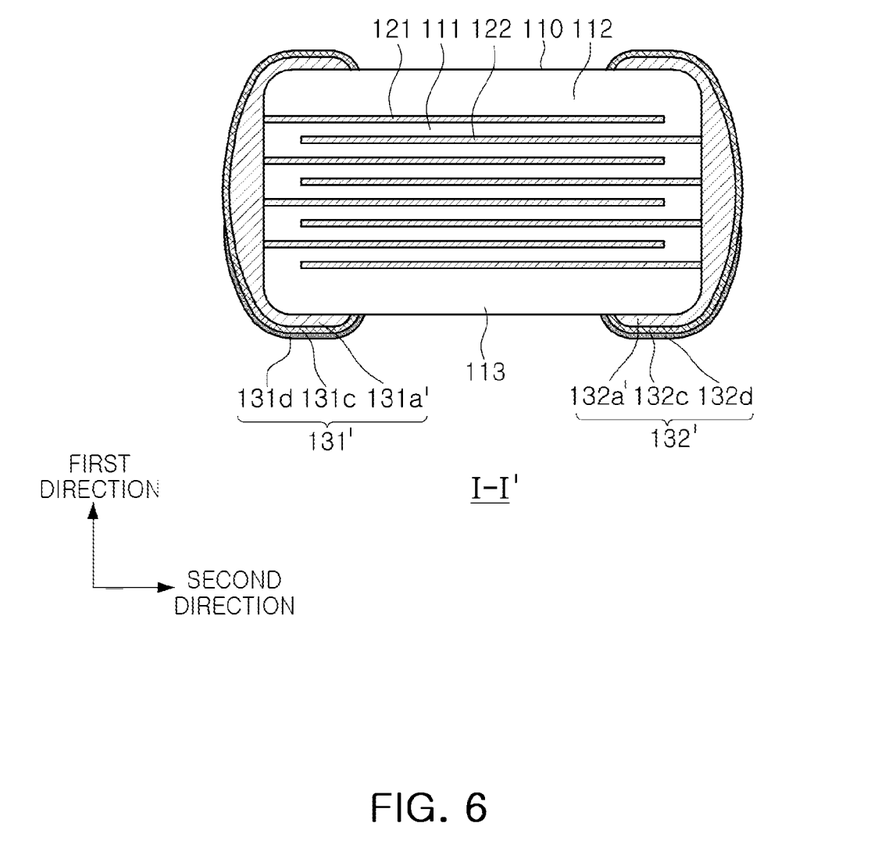
FIG. 6 is a cross-sectional view taken along line I-I' of FIG. 1 according to a modification of an exemplary embodiment in the present disclosure.

FIG. 6 is a cross-sectional view taken along line I-I' of FIG. 1 according to a modification of an exemplary embodiment in the present disclosure.

According to a modification of an exemplary embodiment in the present disclosure, the external electrodes 131' and 132' may not include a conductive resin layer. The external electrodes 131' and 132' may include electrode layers 131a' and 132a' disposed on the body and Ni plating layers 131c and 132c disposed on the electrode layers, and the Pd plating layers 131d and 132d may be disposed on external surfaces of the Ni plating layers 131c and 132c.

Figure 7:
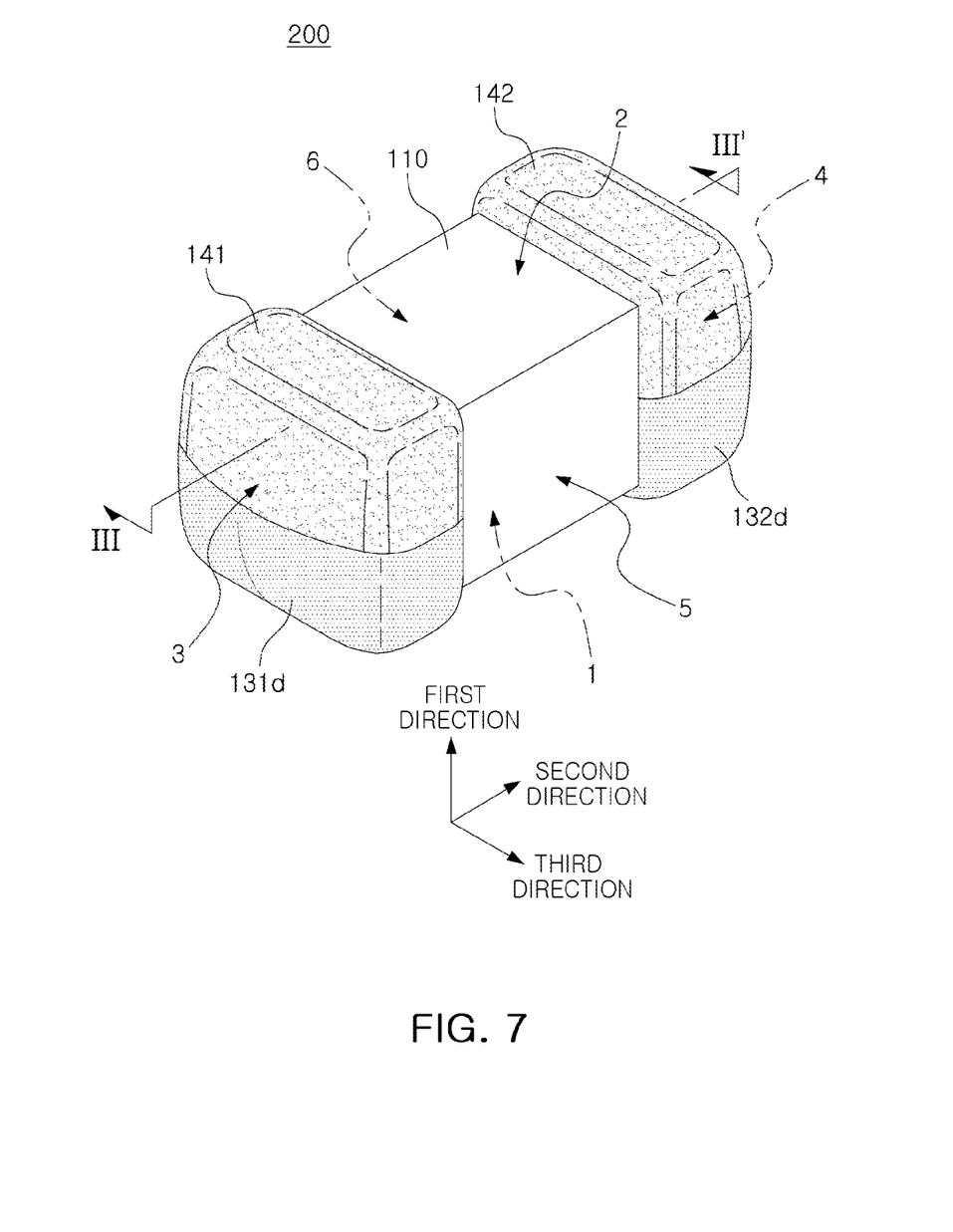
FIG. 7 is a schematic perspective view of a multilayer electronic component according to another modification of an exemplary embodiment in the present disclosure.
Figure 8:
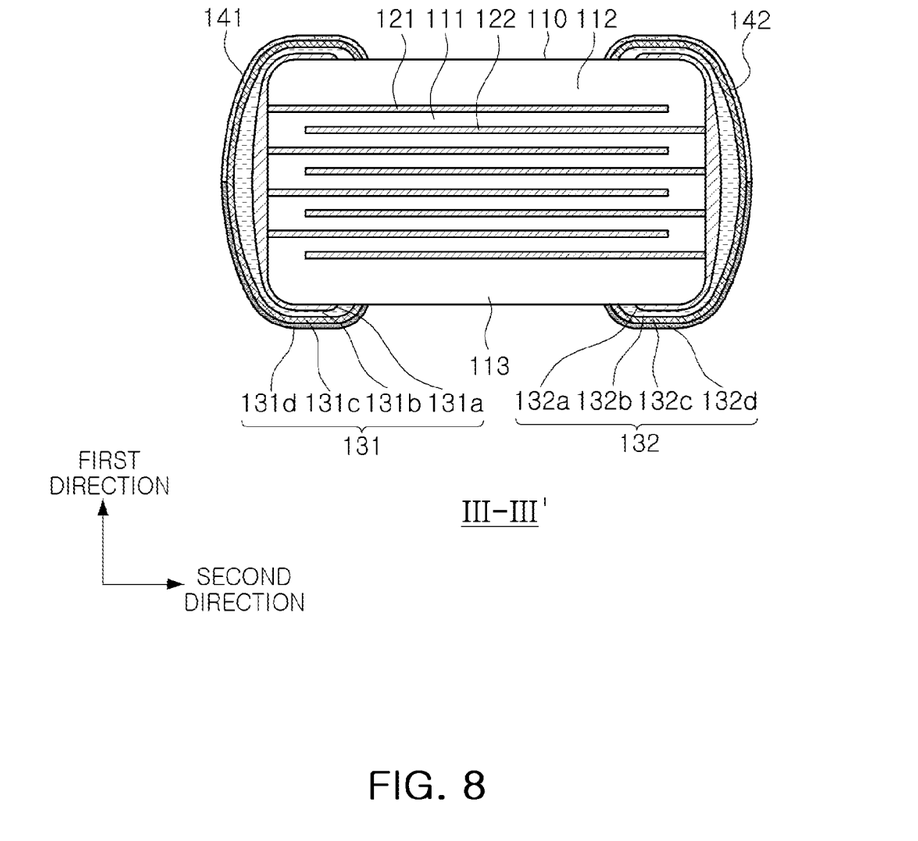
FIG. 8 is a cross-sectional view taken along line III-III' of FIG. 7.

FIG. 7 is a schematic perspective view of a multilayer electronic component according to another modification of an exemplary embodiment in the present disclosure. FIG. 8 is a cross-sectional view taken along line III-III' of FIG. 7.

Referring to FIGS. 7 and 8, in a multilayer electronic component 200 according to another modification of an exemplary embodiment in the present disclosure, insulating layers 141 and 142 may be disposed on external surfaces of regions of the external electrodes 131 and 132 in which the Pd plating layers are not formed, respectively.

Accordingly, the height h of the Pd plating layer may be more easily and accurately controlled, corrosion or precipitation in a region in which the Pd plating layer is not formed may be reliably prevented, and reliability may be further improved.

Board for Mounting Multilayer Electronic Component

Hereinafter, a mounting board 1000 of a multilayer electronic component according to another exemplary embodiment in the present disclosure will be described in detail.

The mounting board 1000 of a multilayer electronic component according to another exemplary embodiment in the present disclosure is a type on which the multilayer electronic component 100 according to an exemplary embodiment in the present disclosure is mounted. Accordingly, description will be made with reference to FIG. 4 which schematically illustrates a perspective view of a mounting board on which a multilayer electronic component is mounted according to an exemplary embodiment in the present disclosure and FIG. 5 which is a cross-sectional view taken along II-II' of FIG. 4, and redundant descriptions of features the same as those of the multilayer electronic component 100 according to an exemplary embodiment will be omitted.

Referring to FIGS. 4 and 5, the mounting board 1000 of the multilayer electronic component includes a substrate 210 with electrode pads 221 and 222 disposed thereon; a multilayer electronic component 100 including a body 110 including a dielectric layer 111 and internal electrodes 121 and 122 and including first and second surfaces 1 and 2 opposing each other in a first direction, third and fourth surfaces 3 and 4 connected to the first and second surfaces and opposing each other in a second direction, and fifth and sixth surfaces 5 and 6 connected to the first to fourth surfaces 1 to 4 and opposing each other in a third direction and external electrodes 131 and 132 including connection portions A1 and A2 disposed on the third and fourth surfaces, upper band portions B1a and B2a extending from the connection portions onto portions of the second surface, and lower band portions B1b and B2b extending onto portions of the first surface. The external electrodes include Pd plating layers 131d and 132d disposed on external surfaces of the lower band portions, and the Pd plating layers are disposed to extend onto portions of the connection portions A1 and A2; and conductive resin adhesives 230 and 240 bonding the external electrodes 131 and 132 to the electrode pads 221 and 222.

Here, the electrode pads 221 and 222 may be disposed to be spaced apart from each other and may be electrically connected to the first and second external electrodes 131 and 132 of the multilayer electronic component 100, respectively.

A thermal curing temperature of the conductive resin adhesives 230 and 240 is lower than a melting point of a solder. Therefore, the use of the conductive resin adhesive, instead of a solder, may reduce thermal stress, thereby improving reliability.

The conductive resin adhesives 230 and 240 may include a conductive metal and a base resin, and the conductive metal may serve to secure electrical connectivity between the external electrodes 131 and 132 and the electrode pads 221 and 222, and the base resin may serve to reduce thermal stress and suppress cracking. A type of the base resin is not particularly limited, and may be, for example, a thermosetting resin such as an epoxy resin.

In this case, the highest point of the Pd plating layers 131d and 132d in the first direction may be higher than the highest point of the conductive resin adhesives 230 and 240 in the first direction. That is, the height hs of the conductive resin adhesive may be lower than the height h of the Pd plating layer. Accordingly, it is possible to prevent corrosion or precipitation of the external electrodes 131 and 132 and improve reliability, while reducing manufacturing cost, by disposing the Pd plating layers 131d and 132d only at portions. In other words, by disposing the Pd plating layers 131d and 132d only in the regions in contact with the conductive resin adhesives 230 and 240, corrosion or precipitation of the external electrodes may be prevented and reliability may be improved, while manufacturing cost is reduced, similar to a case in which the Pd plating layer is disposed on the entire external surface of the external electrodes.

As set forth above, according to an exemplary embodiment, corrosion or precipitation of the external electrodes is prevented and reliability is improved.

According to an exemplary embodiment, manufacturing cost may be reduced, while improving reliability of the multilayer electronic component, by optimizing the arrangement of the Pd plating layer.

According to an exemplary embodiment, the multilayer electronic component suitable for mounting on a substrate using a conductive resin adhesive may be provided.

While example exemplary embodiments have been shown and described above, it will be apparent to those skilled in the art that modifications and variations could be made without departing from the scope of the present disclosure as defined by the appended claims.

What is claimed is:

1. A multilayer electronic component comprising:
    a body including a dielectric layer and internal electrodes and including first and second surfaces opposing each other in a first direction, third and fourth surfaces connected to the first and second surfaces and opposing each other in a second direction, and fifth and sixth surfaces connected to the first to fourth surfaces and opposing each other in a third direction; and
    an external electrode including a connection portion disposed on one of the third and fourth surfaces, an upper band portion extending from the connection portion onto a portion of the second surface, and a lower band portion extending onto a portion of the first surface,
    wherein the external electrode includes a Pd plating layer disposed on an external surface of the lower band portion, and the Pd plating layer is disposed to extend onto a portion of the connection portion so as to only partially cover the connection portion, and
    wherein a region of an external surface of the external electrode in which the Pd plating layer is not formed is exposed.

2. The multilayer electronic component of claim 1, wherein $0.44T < h$ in which T is a first directional distance of the external electrode from a lowermost point to an uppermost point in the first direction and h is a first directional distance from the lowermost point of the external electrode in the first direction to an uppermost point of the Pd plating layer in the first direction, in a cross-section taken in the first and second directions at a center of the body in the third direction.

3. The multilayer electronic component of claim 2, wherein T is 2375 µm or more and 2625 µm or less and h is greater than 1100 µm.

4. The multilayer electronic component of claim 2, wherein T is 1520 µm or more and 1680 µm or less and h is greater than 790 µm.

5. The multilayer electronic component of claim 2, wherein T is 1187.5 µm or more and 1312.5 µm or less and h is greater than 760 µm.

6. The multilayer electronic component of claim 2, wherein T is 760 µm or more and 840 µm or less and h is greater than 730 µm.

7. The multilayer electronic component of claim 2, wherein T is 475 µm or more and 525 µm or less and h is greater than 455 µm.

8. The multilayer electronic component of claim 1, wherein the external electrode includes an electrode layer disposed on the body, a conductive resin layer disposed on the electrode layer, an Ni plating layer disposed on the conductive resin layer, and the Pd plating layer disposed on an external surface of the Ni plating layer.

9. The multilayer electronic component of claim 1, wherein the external electrode includes an electrode layer disposed on the body and an Ni plating layer disposed on the electrode layer, and the Pd plating layer disposed on an external surface of the Ni plating layer.

10. The multilayer electronic component of claim 1, wherein the Pd plating layer is spaced apart from an external surface of the upper band portion in the external electrode.

11. The multilayer electronic component of claim 1, wherein the external surface of the region of the external electrode in which the Pd plating layer is not formed includes the connection portion, the upper band portion, and side band portions respectively extending from the connection portion onto portions of the fifth and sixth surfaces.

12. A board for mounting a multilayer electronic component, the board comprising:
a substrate with an electrode pad disposed thereon;
a multilayer electronic component including a body having a dielectric layer and internal electrodes and including first and second surfaces opposing each other in a first direction, third and fourth surfaces connected to the first and second surfaces and opposing each other in a second direction, and fifth and sixth surfaces connected to the first to fourth surfaces and opposing each other in a third direction, and an external electrode including a connection portion disposed on the third or fourth surface, an upper band portion extending from the connection portion onto a portion of the second surface, and a lower band portion extending onto a portion of the first surface, wherein the external electrode includes a Pd plating layer disposed on an external surface of the lower band portion, the Pd plating layer is disposed to extend onto a portion of the connection portion so as to only partially cover the connection portion, and a region of an external surface of the external electrode in which the Pd plating layer is not formed is exposed; and
a conductive resin adhesive bonding the external electrode to the electrode pad.

13. The board for mounting a multilayer electronic component of claim 12, wherein a highest point of the Pd plating layer in the first direction is higher than a highest point of the conductive resin adhesive in the first direction.

14. The board for mounting a multilayer electronic component of claim 12, wherein the external surface of the region of the external electrode in which the Pd plating layer is not formed includes the connection portion, the upper band portion, and side band portions respectively extending from the connection portion onto portions of the fifth and sixth surfaces.

15. A multilayer electronic component comprising:
a body including a dielectric layer and first and second internal electrodes with the dielectric layer disposed therebetween; and
an external electrode including a connection portion disposed on one surface of the body, from which one of the first and second internal electrodes is exposed, to connect to the one of the first and second internal electrodes, and band portions extending from the connection portion respectively onto surfaces of the body connected to the one surface,
wherein the external electrode includes a Pd plating layer disposed on one of the band portions and is spaced apart from another of the band portions, and
wherein a region of an external surface of the external electrode in which the Pd plating layer is not formed is exposed.

16. The multilayer electronic component of claim 15, wherein the Pd plating layer covers a portion of the connection portion.

17. The multilayer electronic component of claim 15, wherein among the band portions, the Pd plating layer is disposed only on three of the band portions.

18. The multilayer electronic component of claim 15, wherein among the band portions, the Pd plating layer is disposed partially on two of the band portions.

19. The multilayer electronic component of claim 15, wherein $0.44T<h$, in which T is a distance of from a lowermost point of the one of the band portions to an uppermost point of another of the band portions opposing the one of the band portions, and h is a distance from the lowermost point of the one of the band portions to an uppermost point of the Pd plating layer in a direction, in which the one of the band portions and the another of the band portions oppose each other.

20. The multilayer electronic component of claim 19, wherein T is 2375 µm or more and 2625 µm or less and h is greater than 1100 µm.

21. The multilayer electronic component of claim 19, wherein T is 1520 µm or more and 1680 µm or less and h is greater than 790 µm.

22. The multilayer electronic component of claim 19, wherein T is 1187.5 µm or more and 1312.5 µm or less and h is greater than 760 µm.

23. The multilayer electronic component of claim 19, wherein T is 760 µm or more and 840 µm or less and h is greater than 730 µm.

24. The multilayer electronic component of claim 19, wherein T is 475 µm or more and 525 µm or less and h is greater than 455 µm.

25. A board for mounting a multilayer electronic component, the board comprising:
a substrate with an electrode pad disposed thereon;
the multilayer electronic component of claim 14 disposed on the substrate; and a conductive resin adhesive bonding the external electrode to the electrode pad.

26. The board for mounting a multilayer electronic component of claim 25, wherein the external electrode includes an electrode layer disposed on the body, an Ni plating layer disposed on the electrode layer, and the Pd plating layer disposed on an external surface of the Ni plating layer, and
the conductive resin adhesive is spaced apart from the Ni plating layer.

* * * * *